United States Patent [19]

Kerr

[11] 3,739,239

[45] June 12, 1973

[54] SEMICONDUCTOR DEVICE AND METHOD OF MANUFACTURING THE DEVICE

[75] Inventor: George Kerr, Emmasingel, Eindhoven, Netherlands

[73] Assignee: U.S. Philips Corporation, New York, N.Y.

[22] Filed: Feb. 4, 1971

[21] Appl. No.: 112,625

[30] Foreign Application Priority Data

Feb. 14, 1970 Netherlands ........................ 7002117

[52] U.S. Cl. ....... 317/235 R, 317/235 Z, 317/234 M

[51] Int. Cl. .............................................. H01l 5/00

[58] Field of Search ............................. 317/234, 235

[56] References Cited

UNITED STATES PATENTS

| | | | |
|---|---|---|---|
| 3,559,003 | 1/1971 | Beaudouin et al. | 317/234 |
| 3,601,666 | 8/1971 | Leedy | 317/234 |
| 3,504,239 | 3/1970 | Johnson et al. | 317/235 |
| 3,462,658 | 8/1969 | Worchel et al. | 317/235 |

FOREIGN PATENTS OR APPLICATIONS

| | | | |
|---|---|---|---|
| 1,044,469 | 9/1966 | Great Britain | 317/235 |

*Primary Examiner*—John W. Huckert
*Assistant Examiner*—E. Wojciechowicz
*Attorney*—Frank R. Trifari

[57] ABSTRACT

A semiconductor device having a planar structure, in particular a transistor, having at least an emitter zone which is provided with a series resistance in the form of a resistance layer provided on the surface, the resistance layer being also provided elsewhere on the device for a completely different purpose, where it is entirely covered by a metal layer. Application in particular for protection of the emitter-base junction in washed-out emitters in silicon transistors in which the resistance layer consists of titanium and the metallization consists of alunimium.

2 Claims, 11 Drawing Figures

Patented June 12, 1973 3,739,239

3 Sheets-Sheet 1

Figures 1, 2, 3:
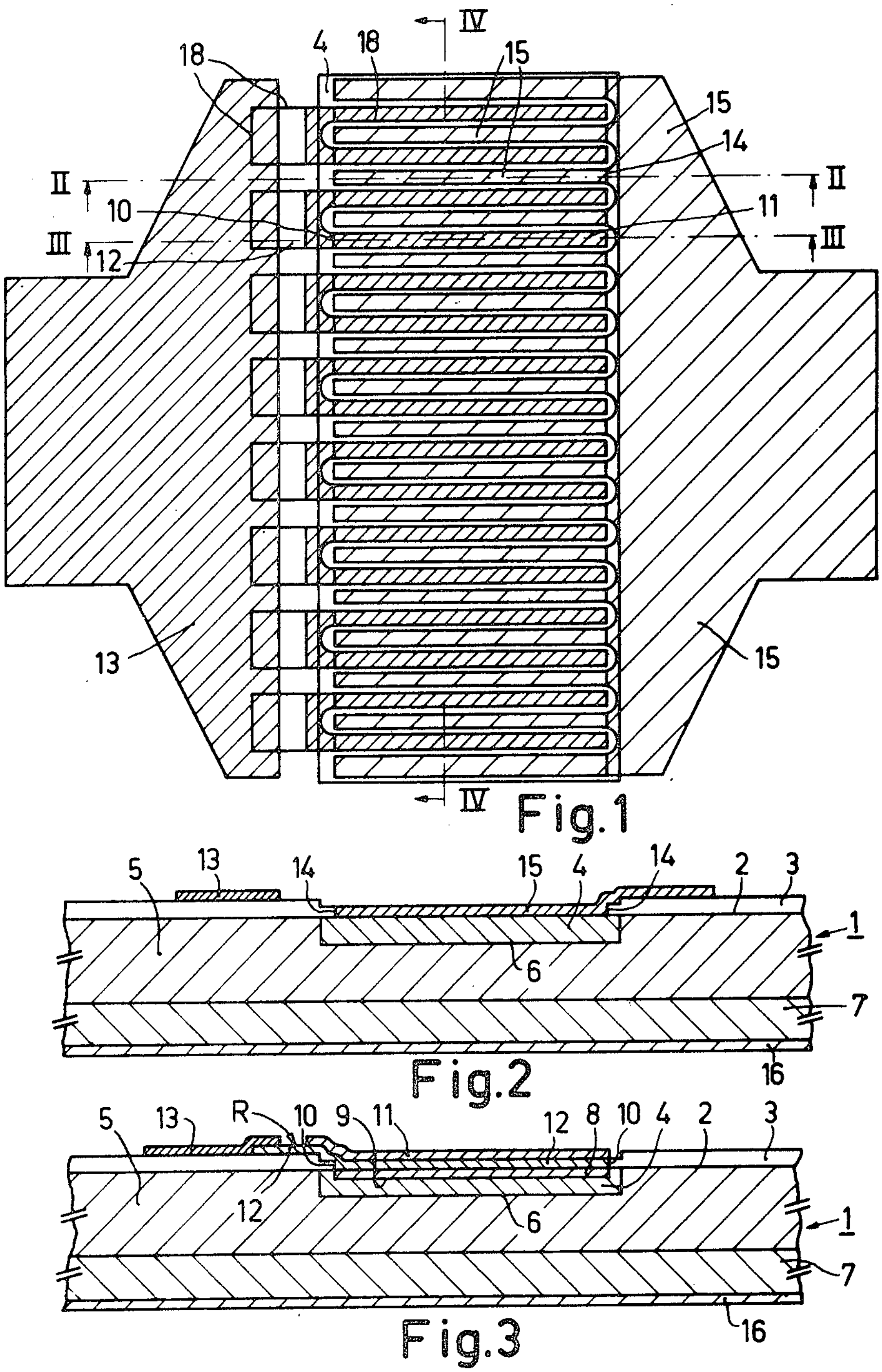

INVENTOR.

GEORGE KERR

BY [signature]

AGENT

*INVENTOR.*

GEORGE KERR

*BY* [signature]

AGENT

INVENTOR.

GEORGE KERR

BY Frank R. Trifari

AGENT

SEMICONDUCTOR DEVICE AND METHOD OF MANUFACTURING THE DEVICE

The invention relates to a semiconductor device comprising a semiconductor body having, a surface which is at least partly covered by an insulating layer, at least one base zone of a first conductivity type adjoining the surface, which zone completely surrounds within the body at least one emitter zone of the second conductivity type, said emitter zone being electrically connected via an emitter contact window in the insulating layer to a metal layer which adjoins outside the window one end of a series resistance formed by a resistance layer, the other end of said series resistance being connected to a connection conductor.

The invention furthermore relates to a method of manufacturing such a device.

Semiconductor devices as described above are known and are usually applied in the form of transistors, although the said emitter and base zones may also form part of other semiconductor devices such a diodes, thyristors, five-layer structures and the like. High frequency transistors having a series resistance in the emitter connection of the above mentioned kind are known. In such high frequency transistors within one base zone there are usually provided a large number of interconnected emitter zones, while usually various base zones are also present. The resistance layer which is applied in series with an emitter zone serves mainly to distribute the emitter current uniformly between the emitter zones present, inter alia to prevent second breakdown in these transistors.

In these known semiconductor devices the resistance layer is used exclusively to form the said series resistances. For the resistance layer a material having a comparatively high resistivity may be used, but also a readily conducting layer, for example, a metal layer may be used which, however, should be sufficiently thin in order to obtain the desired series resistance.

The invention is based inter alia on the recognition that in many cases the material of the resistance layer is not only used to obtain the said series resistance, but that it may also be used in other places of the devices for completely different purpose, so that in the manufacture of the device a multiple goal can be achieved without additional manufacturing stages.

Consequently, a semiconductor device of the kind described in the preamble according to the invention is characterized in that the resistance layer outside the said series resistance is also provided at other areas on the body where it completely covered by a metal layer.

In the device according to the invention the resistance layer may, in dependence on the material chosen, also serve, for example, as an intermediate layer (having negligible resistance in the thickness direction) to obtain better adherence between the metallization and the insulating layer or between the metallization and the semiconductor body, or as a separating layer between two metals, which as such cannot be applied in contact with each other without great difficulty. The resistance layer may also be applied in order to prevent shortcircuit of a p-n junction as will be described below.

In connection herewith a preferred embodiment of the device according to the invention is characterized in that the resistance layer is not only applied at the area of the said series resistance but also within the emitter contact window. Within this window the resistance layer may serve, for example, for improved contacting of the emitter zone by the said metal layer. The resistance layer may then, if desired, also be applied underneath the metal layer between the series resistance and the emitter zone on the insulating layer, for example, to improve the adherence between the metal layer and the insulating layer.

The invention is applied particularly advantageously for protection of the emitter base junction. This p-n junction is often located, particularly in transistors for high frequencies, at a very small distance from the edge of the emitter contact window. In the manufacture of these transistors the emitter diffusion window is often also used as an emitter contact window in the insulating layer which usually consists of silicon oxide, the emitter being in-diffused to a very small depth via this window, after which the layer, usually an oxide layer, formed in the window on the semiconductor surface during this diffusion is removed by a very short etching treatment. An emitter zone formed in this manner is known under the name of "washed-out emitter". The distance between the edge of the emitter contact window and the emitter-base junction is about equal to the diffusion depth. This distance is so small that, during vapor deposition of the emitter contact layer in the window and with the temperature increases occurring during and after this vapor deposition and during assembly, said contact layer, for example, an aluminum layer, short circuits the emitter-base junction due to attack of either, the oxide or the semiconductor material or both. A very important preferred embodiment of the device according to the invention is therefore characterized in that the resistance layer extends along the entire edge of the emitter contact window where it adjoins the insulating layer. This resistance layer, for which titanium is advantageously chosen, protects the insulating layer and the semiconductor material from attack, and prevents the aforementioned short-circuit. In practice very frequently aluminum is applied as a metal layer, the semiconductor body consisting of silicon and the insulating layer of silicon oxide, which is readily attacked by aluminum as is silicon. By the application of a resistance layer of titanium, an adequate protection of the emitter base junction is obtained in the last mentioned preferred embodiment.

The invention furthermore relates to a very efficient method of manufacturing the described semiconductor device. This method, in which first the emitter and base zones are applied in the body, the body is provided at the surface with an insulating layer, and the emitter window is provided in the insulating layer, is characterized in that subsequently a resistance layer is applied, one portion of which is situated within the emitter window and one portion of which is situated outside the emitter window, after which this resistance layer is partly covered with a metal layer, a first portion of which is provided at least partly within the emitter window, and a second portion non-coherent with the first portion is provided outside the emitter window, said second portion serving as a connection conductor for the emitter zone, a portion of the resistance layer which is free from the metal layer and which makes contact with the first and the second portion of the metal layer extending between the two said portions.

According to this method the device according to the invention is obtained without additional diffusion or aligning steps being necessary as compared to the known method of manufacturing the known devices.

In accordance with a preferred embodiment the above described washed-out emitter method is applied, in which first the base zone is diffused in the body and subsequently, via an opening in the insulating layer, the emitter zone is diffused in, after which the emitter contact window is provided by etching until the surface portion of the emitter zone situated within the opening is completely exposed.

The base contact window may be applied in various stages of the manufacturing process. However, the base contact window is preferably provided in the insulating layer before the resistance layer is provided, and subsequently the resistance layer is provided outside this contact window after which the metal layer is so provided so that a portion of this metal layer adjoins the base zone via the base contact window. In that case no material of the resistance layer is present in the base contact window between the base zone and the metal layer, which is generally desired.

Figures 4, 5:
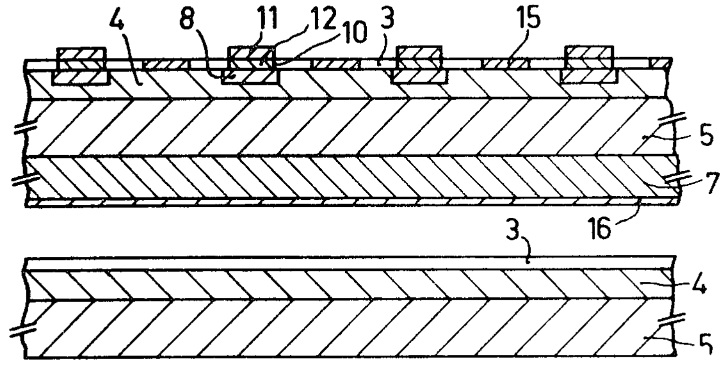
Figure 10:
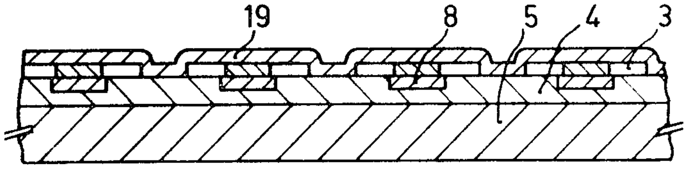
Figure 11:
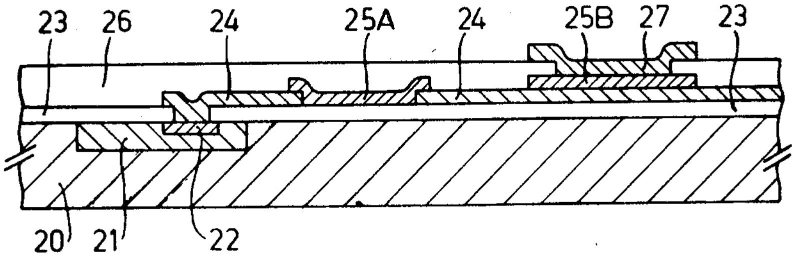

In order that the invention may be readily carried into effect, some embodiments thereof will now be described in detail, by way of example, with reference to the accompanying diagrammatic drawings, in which FIG. 1 is a diagrammatic plan view of a semiconductor device according to the invention, FIGS. 2, 3 and 4 are diagrammatic cross-sectional views of the device shown in FIG. 1 taken on the lines II—II, III—III and IV—IV of FIG. 1, FIGS. 5 to 10 are diagrammatic cross-sectional views of the device shown in FIGS. 1 to 4 in successive stages of manufacture, and FIG. 11 is a diagrammatic cross-sectional view of another embodiment according to the invention.

The figures are diagrammatic and not drawn to scale, in particular the dimensions in the thickness direction are exaggerated for the sake of clarity. Corresponding components are denoted in the figures by the same reference numerals. In the plan view of FIG. 1 metal layers are hatched.

FIG. 1 is a plan view and FIGS. 2 and 3 are cross-sectional views taken on the lines II—II and III—III of FIG. 1 of a semiconductor device according to the invention. The device forms a planar transistor and comprises (see FIGS. 2 and 3) a semiconductor body 1 of silicon which is partly covered at a surface 2 with an insulating layer 3 of silicon oxide. A diffused p-type conductive base zone 4 having a depth of 1 micron, which forms a collector base p-n junction 6 with the n-type portion 5 of the body forming the collector of the transistor, adjoins the surface 2. The n-type region 5 is formed by an epitaxial layer having a substantially homogenous doping and a resistivity of 1Ohm. cm, which is provided on a highly doped n-type substrate 7 having a resistivity of 0.01 Ohm cm. In the base zone 4 (see FIG. 3) a large number of n-type emitter zones, having a depth of 0.6 microns and a width of 3 microns, are diffused, each emitter zone being completely surrounded by the base zone 4 with which they form base-emitter p-n junctions. In the cross-sectional views shown in FIG. 3 one of these zones 8 with the associated p-n junction 9 is indicated.

The emitter zone 8 is electrically connected via an emitter contact window in the oxide layer 3 (the edge of this window is denoted by 10 in FIGS. 1 and 3) to a metal layer 11 of aluminum. This electrical connection is effected in this embodiment via the intermediate layer 12, the purpose and composition of which will yet be described in detail. Outside the window 10 the aluminum layer 11 adjoins one end of a series resistance R which is formed by a resistance layer 12 consisting of a thin layer of titanium of such a thickness that the sheet resistance is 3 Ohm per square. The series resistance R is connected at the other end to a connection conductor in the form of an aluminum layer 13.

The emitter series resistances R serve to improve the current distribution between the emitter zones and to prevent second breakdown.

The base zone 4 is contacted (see FIG. 2) via a number of base contact windows in the oxide layer 3 situated between the emitter zones 8, by means of the aluminum layer 15. The edge of one of these windows is denoted in FIGS. 1 and 2 by 14.

The collector zone 5 is contacted via the highly doped substrate 7 and a metal layer 16 provided thereon.

According to the invention the resistance layer 12 is not only provided at the area of the series resistance R but also elsewhere on the body, that is to say in this embodiment within the emitter contact window 10 in which this layer 12 is completely covered by the aluminum layer 11 and in which it serves a completely different purpose. The p-n junction 9 is situated, due to the very small depth of the emitter diffusion and due to the manner in which the emitter contact window is provided—to be described in detail hereinafter— at a very small distance (a few tenths of a micron) from the edge 10 of the emitter contact window. It is known that when an aluminum layer is provided in this window the oxide and the silicon at the edge of the windows are slightly attacked by the aluminum so that in the present case a great risk of short circuiting of the p-n junction 9 would arise. In the device according to the invention as described above, however, this risk does not exist as the titanium layer 12 extends within the emitter contact window along the entire edge 10 of this window where it adjoins the oxide 3. This is clearly illustrated by FIGS. 3 and 4, the latter being a diagrammatic cross-sectionsl view taken on the line IV—IV of FIG. 1 on a larger scale of a detail of the described transistor. Since the titanium does not or only slightly attack the silicon oxide and the silicon up to a rather high temperature, this titanium layer does not only constitute the emitter series resistance R but also protects the p-n junction 9 from short circuiting by its aluminum layer 11. The resistance of the titanium layer 12 between the aluminum layer 11 and the emitter zone 8, formed by the resistance in the thickness direction of the titanium layer, is of course negligibly small with respect to the resistance R, which is formed by the resistance in a direction parallel to the layer.

The described device is manufactured as follows. The starting material is an n-type silicon plate 7 having a resistance of 0.01 Ohm. cmand a thickness of 200 microns. Of this plate one surface is freed from crystal defects as well as possible by polishing and etching, after which on this surface an epitaxial layer 5 of n-type silicon having a resistivity of 1 Ohm. cm and a thickness of 12 microns is deposited according to the generally used techniques.

The subsequent manufacturing is described with reference to FIGS. 5 to 10 in which for simplicity the substrate 7, which does not play a role in the further processes, is omitted. Like FIG. 4 all these Figures are diagrammatic cross-sectional views taken on the line IV—IV of FIG. 1.

The silicon plate obtained is then oxidized in wet oxygen for 90 minutes at 1,100°C after which masking is effected and a base diffusion window is etched into the oxide layer obtained. Therein boron is diffused to a depth of 0.8 microns with a surface resistance of about 150 Ohm per square. During this diffusion the base zone 4 and an oxide layer 3 are formed so that the structure shown in FIG. 5 is obtained.

Subsequently, emitter diffusion windows are etched in the oxide layer 3 after which via these windows phosphorus is diffused in to form the emitter zones 8. The structure shown in FIG. 6 is then obtained , the base thickness having been slightly increased during the phosphorus diffusion and now amounting to 1 micron, whilst the emitter zones have a thickness of 0.6 micron.

Figure 7:
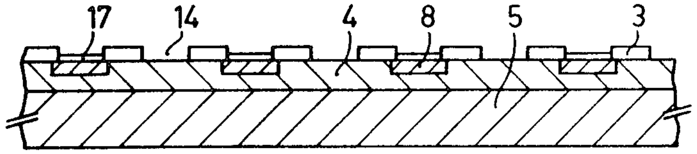

Masking is then effected again and the base contact windows 14 are etched, after which the structure shown in FIG. 7 is obtained.

Figure 6:
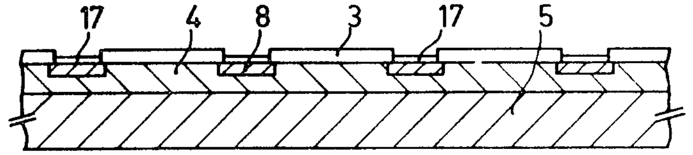

During the phosphorus diffusion a very thin oxide layer 17 contaminated with phosphorus has formed in the emitter diffusion windows (see FIG. 6). The emitter contact windows are then formed by etching the oxide over the entire plate surface until the layer 17 has disappeared (including of course, a slight portion of the surrounding oxide layer 3). This method is known as that of the "washed-out emitter".

Figure 8:
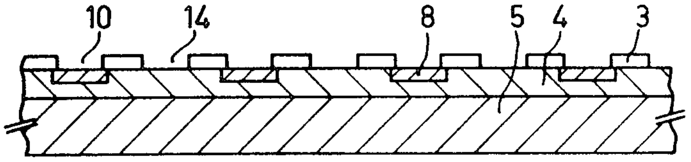
Figure 9:
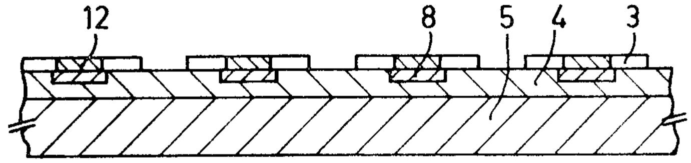

The structure obtained after these treatments is that shown in FIG. 8.

Subsequently, a thin titanium layer 12 is vapor deposited on the entire plate surface until a sheet resistance of 3 Ohm per square is reached. By a masking and etching treatment this titanium layer is then given the shape which is enclosed by the line 18 in FIG. 1, see also FIG. 9.

During the next step an aluminum layer 19 is vapor deposited over the entire surface, see FIG. 10, which layer is subsequently masked and etched — with the aid of an etchant which does not attack the titanium layer 12 — in order to obtain the shaded metal layer portions of FIG. 1. In accordance with the invention, a first portion 11 of the aluminum layer is then provided partly within the emitter contact window 10 whilst a second portion 13 — non-coherent with the first portion 11 — is provided outside the window 10 and serves as a connection conductor for the emitter zones 8. Between the first portion 11 and the second portion 13 (see FIG. 3) a portion of the resistance layer 12 extends which is free from aluminum and which makes contact with both portions 11 and 13 of the aluminum layer.

After providing the metal layer 16 on the substrate, the structure shown in FIGS. 1 to 4 is ultimately obtained.

It is to be noted that on the same silicon plate various base zones may be provided in which, in order to increase the power to be supplied, various transistor structures of the described kind may be manufactured with a common collector on one and the same crystal plate, the base zones and also the emitter zones being mutually interconnected.

The device, finally, is assembled in the normal manner and is enclosed in a suitable envelope.

In the chosen embodiment, as shown in FIG. 1, each time two emitter zones 8 have one titanium layer portion in common. In circumstances, depending inter alia on the mutual distance of the emitter zones, one single coherent part of the resistance layer may also be provided, the metal layer 13 and all emitter contact layers 11 adjoining said coherent part. If desired, it is also possible to provide each emitter zone with a separate series resistance which is noncoherent with the other resistances. Furthermore it is not at all necessary for the portions of the resistance layer inside and outside the emitter contact window to be mutually coherent.

The sequence in which, after providing the emitter zones, the contact windows, the metal layers and the resistance layers are provided, may be changed if desired.

For example, in the above embodiment the base contact windows may also be provided after the emitter contact windows. In accordance with another variant, after the emitter diffusion and the formation of the emitter contact windows a titanium layer is deposited throughout the surface, after which at the area of the base contact windows to be formed openings are etched in the titanium layer. The titanium pattern thus obtained is then used as an etching mask for etching the base contact windows after which the titanium pattern is subjected, if necessary, to a further etching treatment in order to obtain its definite shape after which the aluminum pattern is provided. Other variations may likewise be made those skilled in the art. In as far as in some of these embodiments the resistance layer is also provided in the base contact windows below the metal layer, this may lead to an excessively high base resistance in circumstances, depending on the surface doping of the base zone, which can be avoided, for example, by an additional base contact diffusion.

The above chosen example related to the case in which the resistance layer is also used as a protective layer. A suitable choice of the material of the resistance layer in connection with the desired protective properties is then necessary, of course. This choice can be made without difficulty in all cases by those skilled in the art.

The resistance layer, however, may also be applied for completely different purposes such as the protection of p-n junctions, for example, in order to obtain a better adherence and/or a better ohmic contact between the metal layers and the insulating layer of the semiconductor surface. This may be of importance, for example, for a planar silicon structure with metallization of, for example, molybdenum, in which case a very thin layer of aluminum is suitable as a resistance layer and also as adherence layer.

The resistance layer may also be used as a transition layer between two metal layers which cannot be applied in contact with each other without great difficulty, for example, gold and aluminum. If, for example, in FIGS. 1 to 4 a layer 13 of gold and a layer 11 of aluminum are used, the layer 12 serves a threefold purpose, that is to say for the formation of the resistance R, for the protection of the p-n junction 9 and also as a junction between the gold layer 13 and the aluminum layer 11. In that case, for example, molybdenum may also be applied advantageously for the layer 12. An example of such a structure is shown in FIG. 11, which is a cross-sectional view of a transistor having a collector zone 20, a base zone 21 and an emitter zone 22. On the semiconductor surface a layer 23 of silicon oxide is provided. An aluminum layer 24 makes contact, via a window in the oxide layer 23, with the emitter zone 22 and is interrupted at the area of the emitter series resistance which is formed by a portion of a titanium layer 25 A. Another portion 25 B of the same titanium layer is provided elsewhere on the aluminum layer 24. On top of the aforesaid layers a second oxide layer 26 is provided which has a window through which only a portion of the titanium layer 25 B is exposed. A gold layer 27 makes contact, via this window, with the titanium layer 25B so that the gold and the aluminum are not in direct contact with each other, so that "purple plaque" is avoided. The oxide layer 26 furthermore protects the gold-titanium junction from corrosion by the ambient atmosphere.

The essence of the invention lies in all these cases in that the resistance layer can serve virtually without additional process steps in the same device for completely different purposes than the formation of a resistance.

After the foregoing it will be obvious that the invention is by no means restricted to the given embodiment, but that, without departing from the scope of the invention, many variants are possible to those skilled in the art. For example, the invention may be applied not only in transistors but also in other devices having a series resistance in the emitter circuit, for example, thyristors and diodes. It is also possible to apply other semiconductor materials, other insulating layers, for example, silicon nitride or aluminum oxide or combinations thereof, other metal layers or other resistance layers, for which in all cases a suitable choice can be made from the material considered suitable by those skilled in the art. For instance as a resistance material instead of titanium other metals or semiconductors could be used, such as molybdenum, tantalum, nickel, silicon, or mixtures of these materials and/or of their oxides. The required dimensions and sheet resistances may be chosen by any worker skilled in the art according to the specific requirements.

What is claimed is:

1. A semiconductor device comprising a semiconductor body having a major surface and containing at least one transistor having base and emitter zones, said base zone being of a first conductivity type and extending to the major surface, said emitter zone being of a second conductivity type and extending to the major surface and being nested within the base zone, an insulating layer on the major surface and having an emitter window over the emitter zone, an emitter metallization on the insulating layer for receiving an emitter connection, a layer of resistance material on the device and comprising at least first and second spaced portions, said first resistance portion being on the insulating layer, means connecting a part of the first resistance portion to the emitter metallization, means connecting another part of the first resistance portion through the emitter window to the emitter zone, the surface of said first resistance portion being free of a conductive layer whereby said first resistance portion performs the function of an emitter resistor, said second resistance portion being on the emitter metallization, and a metal layer on and short-circuiting said second resistance portion, whereby said second resistance portion performs the function of a barrier layer between the metal layer and the emitter metallization.

2. A device as set forth in claim 1 wherein the semiconductor is of silicon, the insulating layer is of silicon oxide, the resistance layer is of titanium, and the metallization is of aluminum and the metal layer of gold.

* * * * *